(12) United States Patent
Gruening et al.

(10) Patent No.: US 6,258,659 B1
(45) Date of Patent: Jul. 10, 2001

(54) EMBEDDED VERTICAL DRAM CELLS AND DUAL WORKFUNCTION LOGIC GATES

(75) Inventors: Ulrike Gruening, Munich (DE); Ramachandra Divakaruni, Somers, NY (US); Jack A. Mandelman; Thomas S. Rupp, both of Stomrville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/725,412

(22) Filed: Nov. 29, 2000

(51) Int. Cl.$^7$ .............................................. H01L 21/8242
(52) U.S. Cl. ........................................... 438/243; 438/248
(58) Field of Search .................................. 438/239–249, 438/381, 386–392

(56) References Cited

U.S. PATENT DOCUMENTS

| | | | |
|---|---|---|---|
| 5,827,765 | 10/1998 | Stengl et al. | 438/243 |
| 5,981,332 | 11/1999 | Mandelman et al. | 438/246 |
| 6,150,210 | * 11/2000 | Arnold . | |

* cited by examiner

Primary Examiner—Jey Tsai
(74) Attorney, Agent, or Firm—Eric W. Petraske; Cantor Colburn LLP

(57) ABSTRACT

A process for producing very high-density embedded DRAM/very high-performance logic structures comprising fabricating vertical MOSFET DRAM cells with salicided source/drain and gate conductor dual workfunction MOSFETs in the supports.

6 Claims, 8 Drawing Sheets

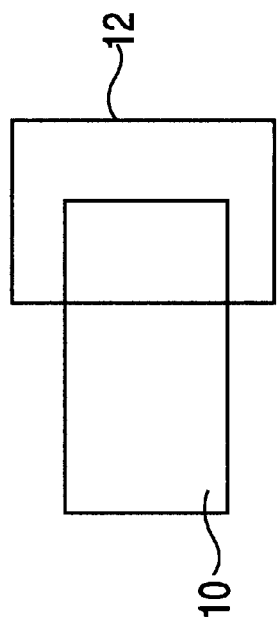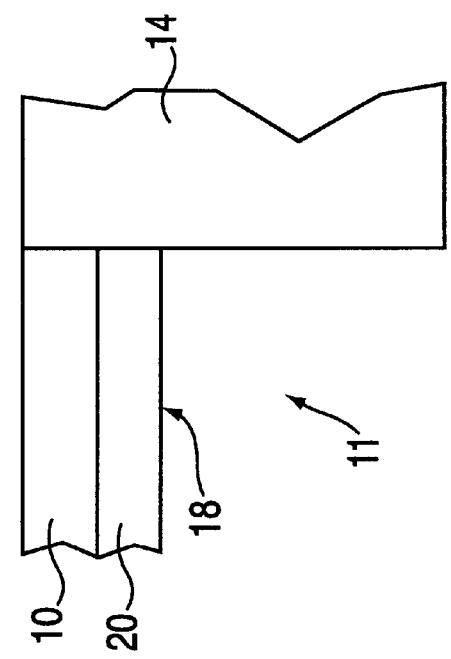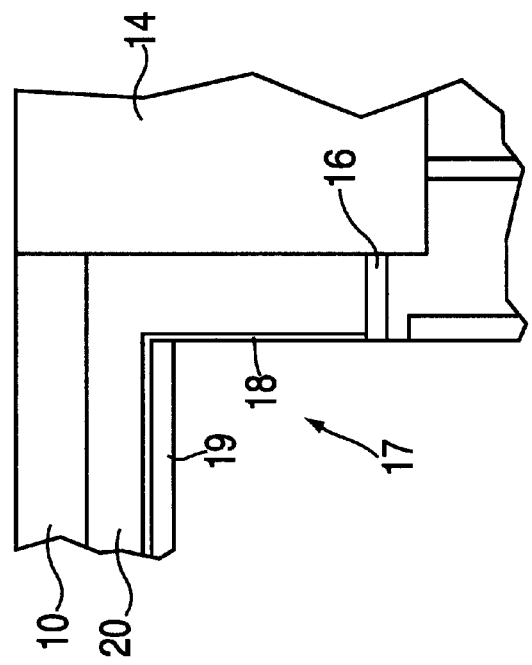

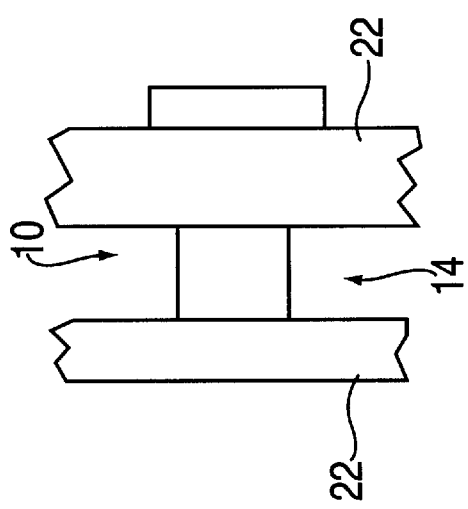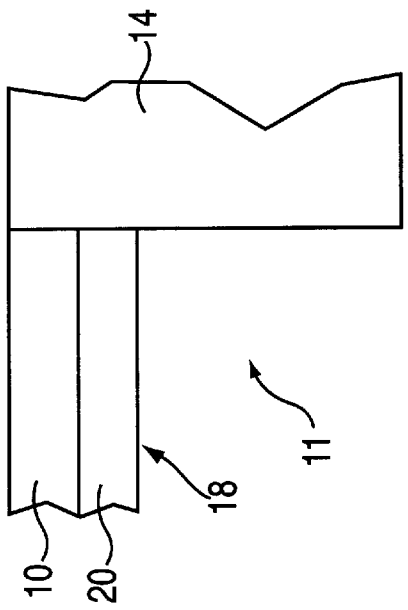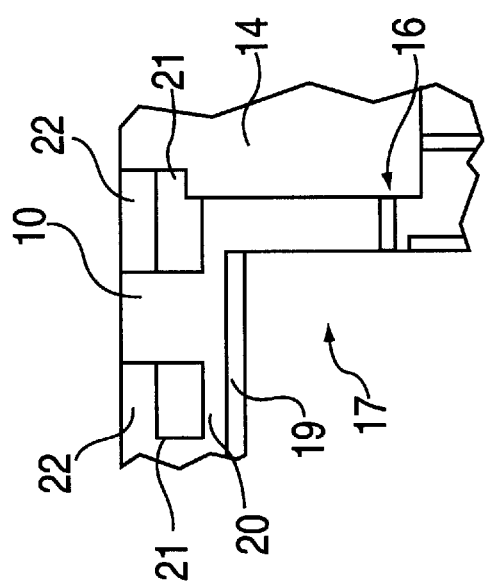

EMBEDDED VERTICAL DRAM CELLS AND DUAL WORKFUNCTION LOGIC GATES

BACKGROUND OF THE INVENTION

The present invention relates to processes for the fabrication of embedded vertical DRAM cells and dual workfunction logic gates. In particular, it relates to a novel process for the fabrication of very high-density embedded DRAM and very high-performance support MOSFETs.

A MOSFET is used in forming dynamic random access memory (DRAM). A DRAM circuit will usually include an array of memory cells interconnected by rows and columns, which are known as wordlines and bitlines, respectively. Reading data from, or writing data to, memory cells is achieved by activating selected wordlines and bitlines. Typically, a DRAM memory cell comprises a MOSFET connected to a capacitor. The capacitor includes gate and diffusion regions which are referred to as either drain or source regions, depending on the operation of the transistor.

There are different types of MOSFETs. A planar MOSFET is a transistor where a surface of the channel region of the transistor is generally parallel to the primary surface of the substrate. A vertical MOSFET is a transistor where a surface of the channel region of the transistor is generally perpendicular to the primary surface of the substrate. A trench MOSFET is a transistor where a surface of the channel region of the transistor is not parallel to the primary surface of the substrate and the channel region lies within the substrate. For a trench MOSFET, the surface of the channel region is usually perpendicular to the primary surface, although this is not required.

Specifically, trench capacitors are frequently used with DRAM cells. A trench capacitor is a three-dimensional structure formed into a silicon substrate. This is normally formed by etching trenches of various dimensions into the silicon substrate. Trenches commonly have N+ doped poly-silicon as one plate of the capacitor (a storage node). The other plate of the capacitor is formed usually by diffusing N+ dopants out from a dopant source into a portion of the substrate surrounding the lower part of the trench. Between these two plates, a dielectric layer is placed which thereby forms the capacitor.

To prevent carriers from traveling through the substrate between the adjacent devices, e.g. capacitors, device isolation regions are formed between adjacent semiconductor devices. Generally, device isolation regions take the form of thick field oxide regions extending below the surface of the semiconductor substrate. The most common early technique for forming a field oxide region is the local oxidation of silicon ("LOCOS") technique. LOCOS field oxidation regions are formed by first depositing a layer of silicon nitride ("nitride") on the substrate surface and then selectively etching a portion of the silicon nitride layer to form a mask exposing the substrate where the field oxidation will be formed. The masked substrate is placed in an oxidation environment and a thick silicon oxide layer is grown at the regions exposed by the mask, forming an oxide layer extending above and below the surface of the substrate. An alternative to LOCOS field oxidation is the use of shallow trench isolation ("STI"). In STI, a sharply defined trench is formed in the semiconductor substrate by, for example, anisotropic etching. The trench is filled with oxide back to the surface of the substrate to provide a device isolation region. Trench isolation regions formed by STI have the advantages of providing device isolation across their entire lateral extent and of providing a more planar structure. Using improved isolation, continued reductions in size are possible.

Present trends in DRAM technology constantly are driving towards continued scaling of minimum feature size (F) in the DRAM array, and more compact cell layouts (e.g., $7F^2$, $6F^2$). As a result of the need for ever increasing array densities, the scalability of contemporary planar MOSFET cells using trench storage capacitors for F=150 nm and beyond is facing fundamental concerns. Increased P-well doping concentration required to satisfy off-current objectives results in a marked increase in array junction leakage, which degrades retention time. The scalability of the MOSFET, by itself, is driving the paradigm shift towards vertical MOSFET access transistors in the array.

An additional influence towards reduction in minimum feature size and increasing levels of integration is requirements by semiconductor chip customers for products having more and more function on a single silicon chip. For example, embedded DRAM/Logic (EDRAM) products rapidly are gaining popularity.

For memory producers to be competitive in the marketplace, it is required that the DRAM portion of the chip feature very high density (for memory productivity) concurrently with very high performance support MOSFETs. Achieving this combination of objectives is a major challenge to the industry.

SUMMARY OF THE INVENTION

Now, according to the present invention, a novel process has been developed for producing very high-density embedded DRAM/very high-performance logic structures. The process comprises making vertical MOSFET DRAM cells with salicided source/drain and gate conductor dual workfunction MOSFETs in the supports. The process features the employment of a single block mask and etching level to define the borderless bitline contact in the array in the same operation in forming the gate conductor for the supports. The process also provides for a bitline contact which is self-aligned to the active area (borderless to adjacent Raised Shallow Trench Isolation (RSTI)); and eliminates a Boron-Phospho-Silicate Glass (BPSG) reflow step, reducing the thermal budget and allowing shallower source/drains.

BRIEF DESCRIPTION OF THE DRAWINGS

FIGS. 1–18 illustrate top and cross-sectional views of a DRAM array and support MOSFET at progressive stages of production.

DETAILED DESCRIPTION OF PREFERRED EMBODIMENTS

Figure 5:
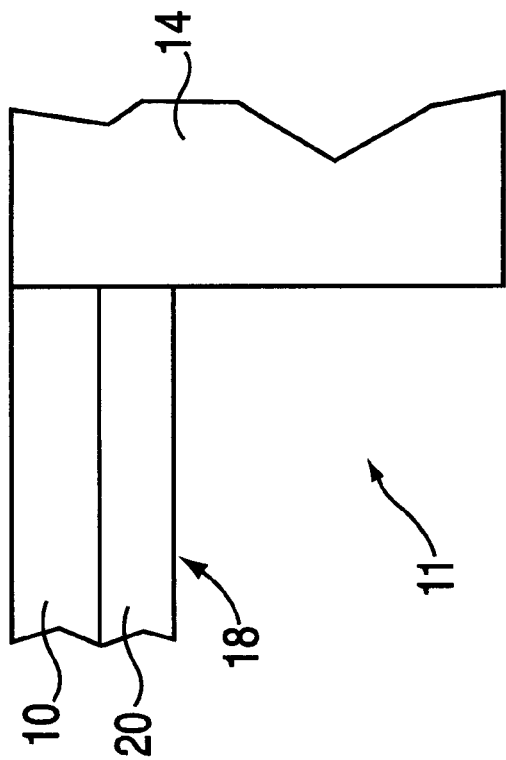

Referring now to the drawings, FIG. 1 represents a top view of a DRAM array comprising active area (AA) nitride pad area 10 and deep trench (DT) area 12. A storage capacitor is formed within the lower portion of the DT 12, with a gate conductor 20 in the upper portion. A cross-sectional view of the array is illustrated in FIG. 2, with a cross-sectional view of the support MOSFET illustrated in FIG. 3. The structure shown for the array and in the supports represents the structure following STI planarization. Standard processing known in the art for fabricating vertical MOSFET DRAMs in a silicon substrate 11 is applied through the step of defining the active areas nitride pad 10 and shallow trench isolation (STI) 14 planarization. These standard processing techniques include formation of the storage capacitors in deep trenches, depositing the trench top oxide (TTO) 16, well implants 17, implant for bitline diffusion 19, removal of original pad structure, growth of gate oxide 18, gate poly-silicon 20 deposition and planarization, and deposition of a new pad nitride layer 10. Active areas are patterned in the new pad nitride layer 10.

Figure 4:
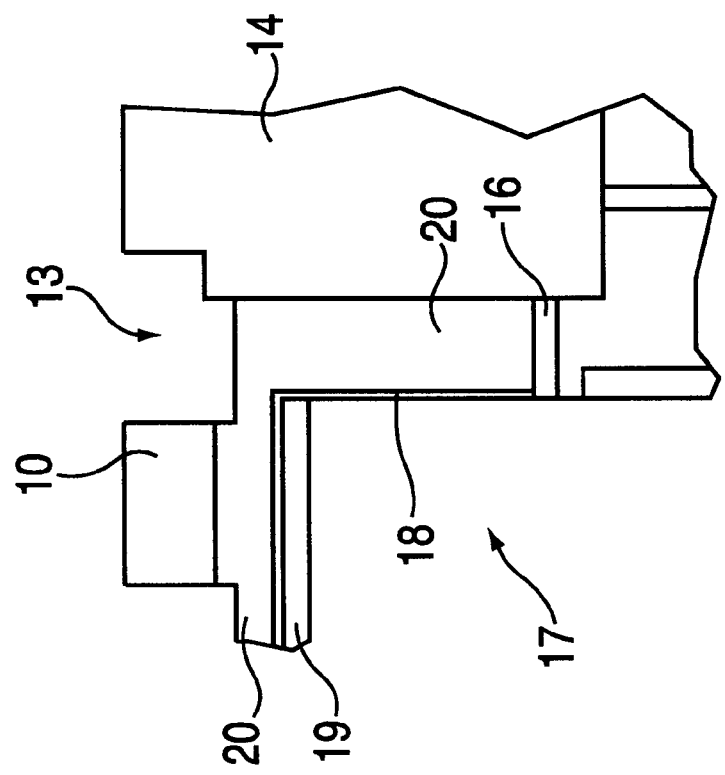

The nitride pad 10 that is used to pattern the STI is made sufficiently thick to define the height of the wordline stack to be formed subsequently. The wordline stack height must allow for the inclusion of a silicide layer (e.g., tungsten silicide ($WSi_x$)) layer and an oxide cap. As shown in FIGS. 4 and 5, using an array gate conductor (GC) mask, a photoresist layer (not shown) is patterned. Then, the nitride layer 10 and STI 14 are reactive ion etched (RIE'd) to form channels 13 for damascened wordline conductors. The exposed array GC polysilicon 20 may then be recessed to provide the desired height for the inclusion of $WSi_x$ and cap oxide layers. The support MOSFET areas, as depicted in FIG. 5 are not etched during this step.

Turning to FIGS. 6–8, a $WSi_x$ layer 21 is deposited into the channels 13 in the exposed GC polysilicon 20 and STI 14, and then is planarized to the top surface of nitride layer 10. The $WSi_x$ layer then is recessed; a tetraethyl othosilicate (TEOS) layer 22 is deposited into the recess and then planarized to the top surface of nitride 10, forming an insulating cap over the wordline conductors.

Figure 10:
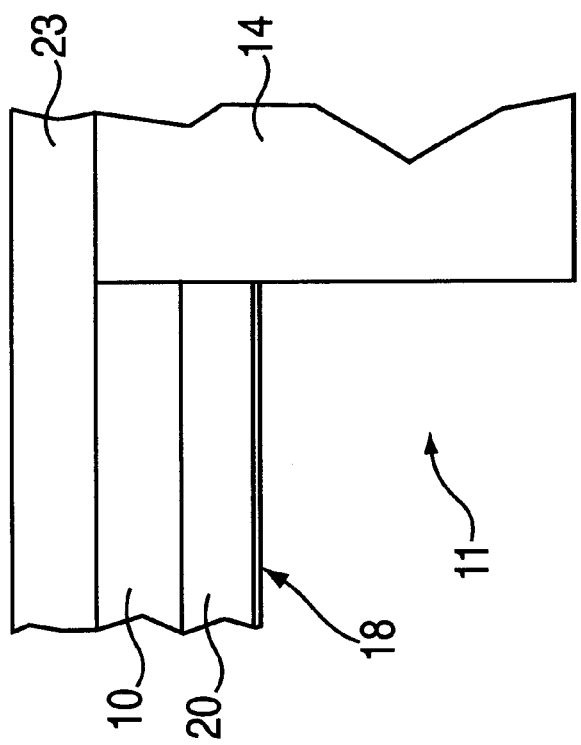
Figure 9:
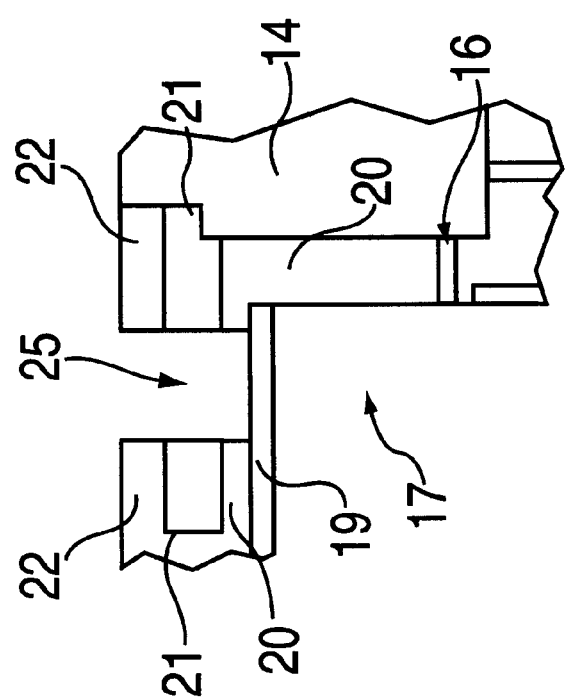

Next, a mid ultra violet (MUV) photoresist block mask 23 is used to allow photoresist to protect the supports (FIG. 10) while the array nitride is stripped for subsequent etching of the exposed polysilicon 20. After the nitride 10 layer is stripped in the array, the exposed polysilicon 20 is RIE'd to the surface of the underlying gate oxide 18 to form the structure depicted in FIG. 9. This techniques leaves a thick oxide layer 22 everywhere in the array, except for the recess 25 in which diffusion stud CB polysilicon is to be formed. The photoresist mask 23 then is stripped.

Figure 12:
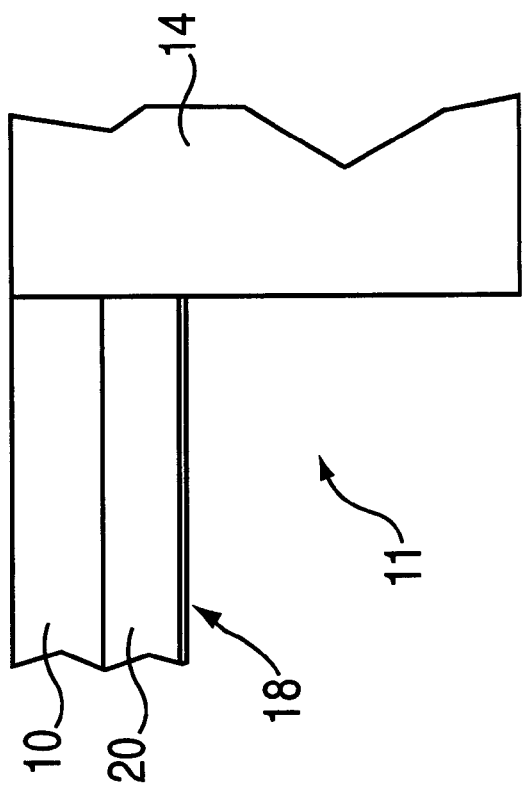
Figure 11:
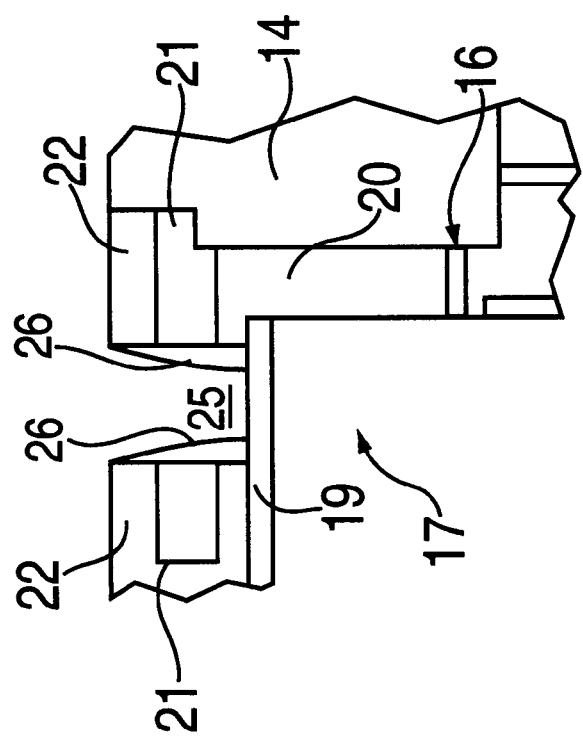

Turning to FIGS. 11 and 12, a gate (wordline) sidewall oxide then is grown on the sidewalls of recess 25, followed by deposition of a TEOS oxide layer which is reactive ion etched to form oxide spacers 26 on the sidewalls of the wordlines.

Figure 14:
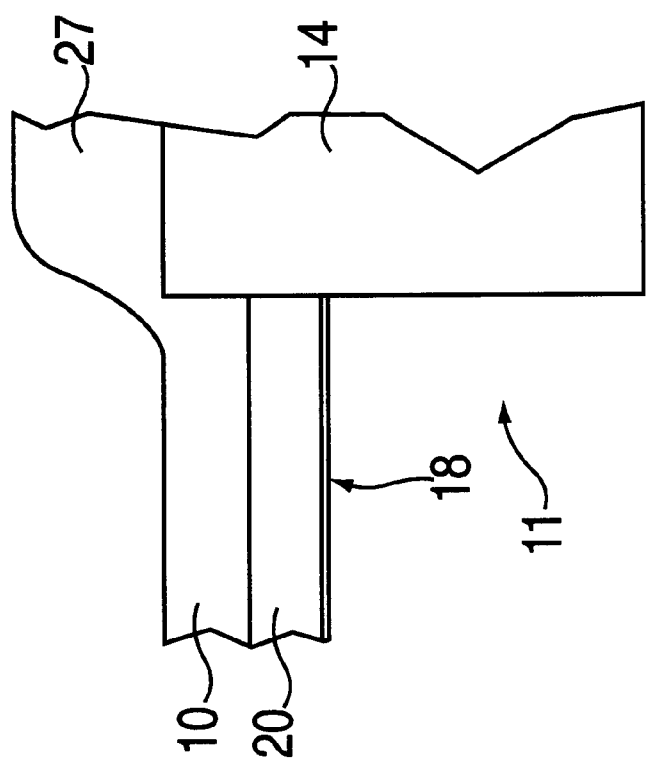
Figure 13:
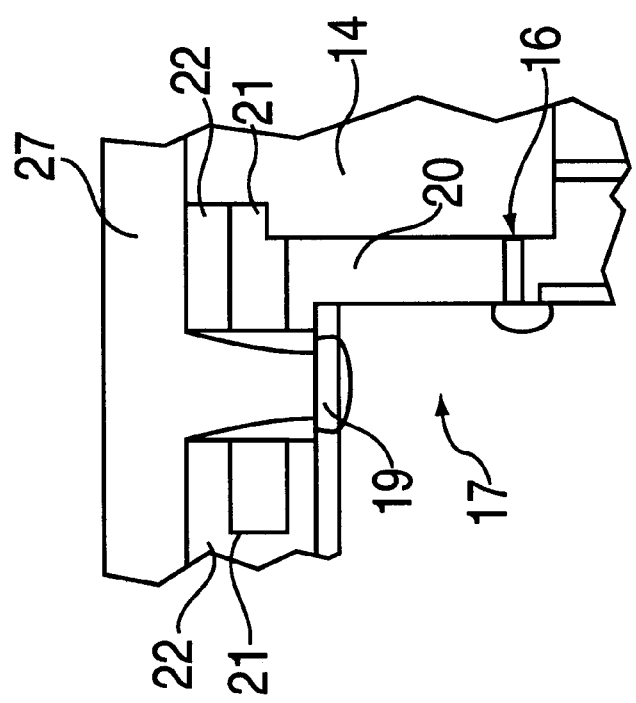

At this point, illustrated in FIGS. 13 and 14, the remaining nitride 10 in the supports is stripped, and a second layer of undoped polysilicon 27 is deposited. N+ bitline implants 19 are made early in the process, prior to formation of gate oxide 18. An additional N+ bitline contact implant is made into the exposed silicon surface between wordline conductors, prior to deposition of polysilicon 27.

Figure 16:
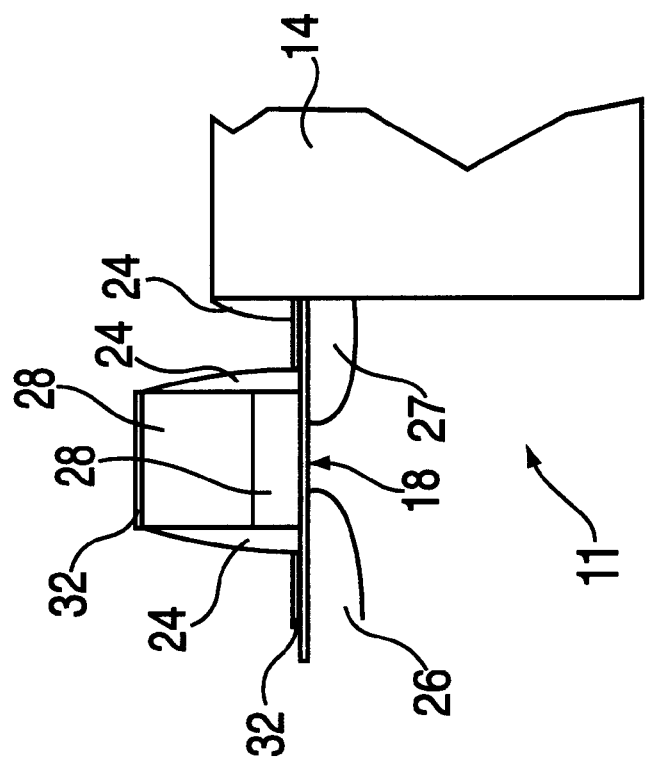
Figure 15:
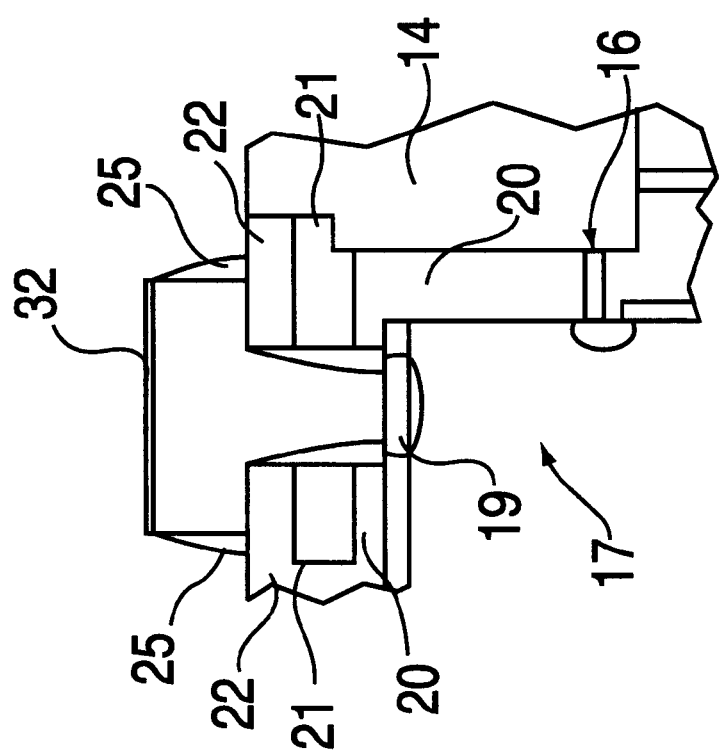

Moving to FIGS. 15 and 16, a deep ultra violet DUV photoresist layer mask is used to define the boundaries of a diffusion stud landing pad and the gates of the support MOSFETs, which then are RIE'd. Gate sidewall spacers 24 then are formed in the support, using standard techniques. Support source/drain regions 26 and 27, dual workfunction polysilicon gate conductors 28, and diffusion stud CB polysilicon 29 are implanted in separate steps. Spacers 24 and 25 are formed simultaneously on the sidewalls of bitline polysilicon (CB poly) 29 and the support gate conductors 28. A layer of insulating material (e.g., SiO2, SiN) is deposited conformally and then anisotropically etched (e.g., RIE'd) to form spacers 24 and 25. Then, the tops of the gate conductors 28, the diffusion stud 29 landing pad, and source/drain diffusions 26/27 are salicided with layer 32.

Figure 17:
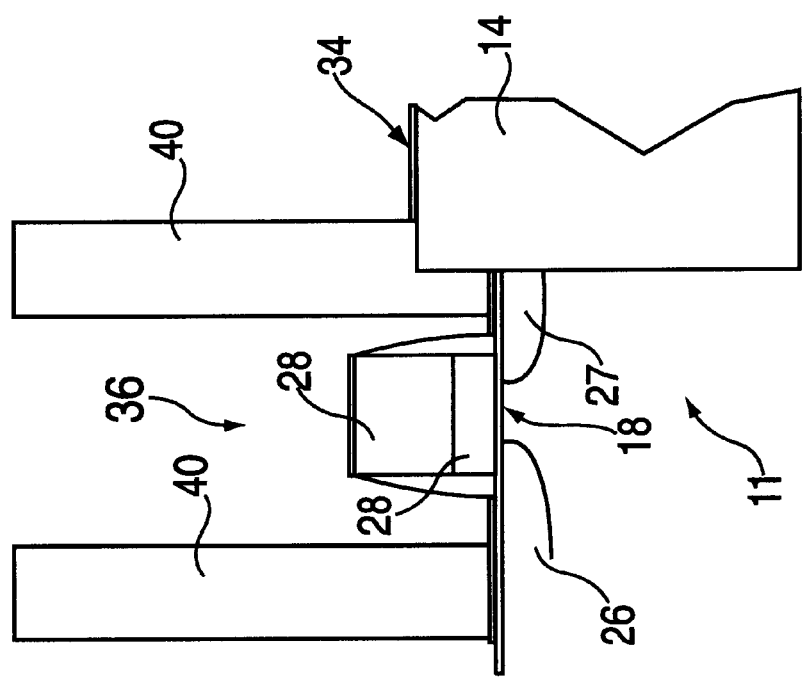
Figure 18:
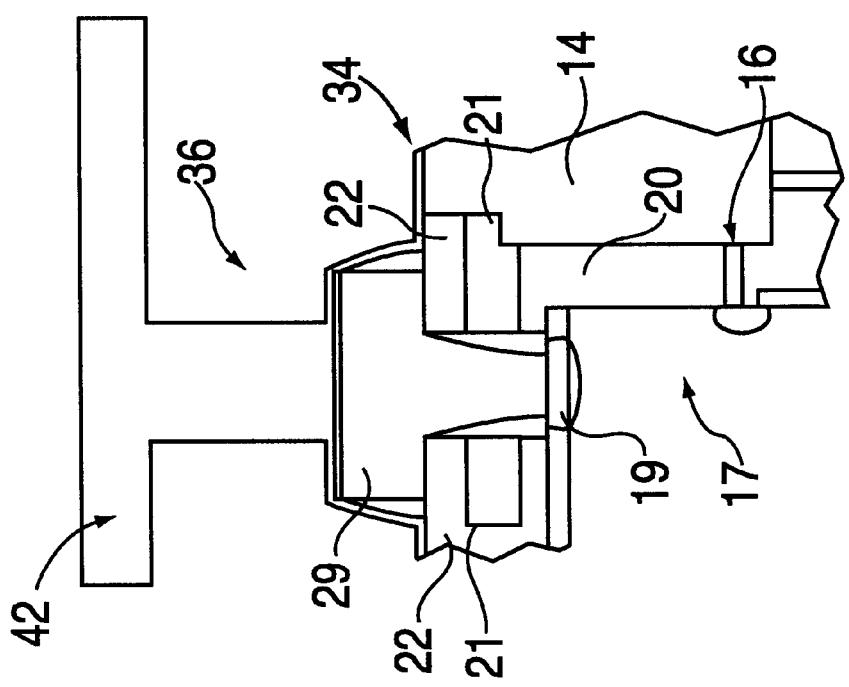

Finally, referring to FIGS. 17 and 18, processing continues with the deposition of a thin nitride barrier etch-stop layer 34, followed by an interlevel oxide layer 36 such as, BPSG (boron phosphorous silicate glass). Then, using a dual damascene process, vias are opened up after first RIE reactive ion etching the interlevel oxide layer. The dual damascene processing also forms the first level of metal wiring channels for the bitlines. The nitride barrier 34 then is opened, and tungsten 40 is deposited and polished to damascene the conductors into the previously formed wiring channels. Standard processing then continues to form the various wiring levels, vias, and interlevel dielectric layers. Tungsten (W) for the bitlines is deposited into the wiring channels by well known CVD processes.

While preferred embodiments have been shown and described, various modifications and substitutions maybe made thereto by one skilled in the art without departing from the spirit and scope of the invention. Accordingly, it is understood that the present invention has been described by way of illustration only, and such illustrations and embodiments as have been disclosed herein are not to be construed as limiting the scope of the claims.

We claim:

1. A method of forming a memory array and support transistors comprising:

forming a trench capacitor in a silicon substrate having a gate oxide layer, a polysilicon layer, and a top dielectric nitride layer deposited thereon;

applying a patterned mask over the array and support areas and forming recesses in the nitride layer, the polysilicon layer, and shallow trench isolation region;

forming a silicide and an oxide cap in the recesses in the nitride layer, the polysilicon layer, and shallow trench isolation region;

applying a block mask to protect the supports while stripping the nitride layer from the array and etching the exposed polysilicon layer to the top of the gate oxide layer;

stripping the nitride layer from the support region and depositing a polysilicon layer over the array and support areas;

applying a mask to pattern and form a bitline diffusion stud landing pad in the array and gate conductors for the support transistors;

saliciding the tops of the landing pad and the gate conductors;

applying an interlevel oxide layer and then opening vias in the interlevel oxide layer for establishing conductive wiring channels.

2. The method of claim 1 wherein a single photoresist mask is applied to pattern both a bitline diffusion stud landing pad of the array and gate conductors of support MOSFETs.

3. The method of claim 1 wherein wordline conductors are formed by applying a mid ultra violet mask to protect the supports while partially etching the polysilicon layer.

4. The method of claim 1 wherein the tops of the landing pad and the gate conductors are salicided concurrently.

5. The method of claim 1 wherein a bitline contact self-aligned to the gate oxide layer is formed by applying a block mask and etching the exposed polysilicon layer.

6. A method of forming an embedded DRAM array and support MOSFETs comprising:

forming a trench capacitor in a silicon substrate having a gate oxide layer, a polysilicon layer, and a top dielectric nitride layer deposited thereon;

applying a patterned mask over the array and support areas and forming recesses in the nitride layer, the polysilicon layer, and shallow trench isolation region;

forming a tungsten silicide and an oxide cap in the recesses in the nitride layer, the polysilicon layer, and shallow trench isolation region;

applying a block mask to protect the supports while stripping the nitride layer from the array and forming wordline conductors by partially etching the exposed polysilicon layer to the top of the gate oxide layer; stripping the nitride layer from the support region and depositing a polysilicon layer over the array and support areas;

applying a single mask to pattern and form a bitline diffusion stud landing pad in the array and gate conductors for the support MOSFETs;

concurrently saliciding the tops of the landing pad and the gate conductors;

applying an interlevel oxide layer and then opening vias in the interlevel oxide layer for establishing conductive wiring channels.

* * * * *